Oct. 20, 1970 I. HALLER ET AL 3,535,137
METHOD OF FABRICATING ETCH RESISTANT MASKS
Filed Jan. 13, 1967 2 Sheets-Sheet 1

INVENTORS
IVAN HALLER
MICHAEL HATZAKIS
RANGASWAMY SRINIVASAN
BY Thomas J. Kilgannon Jr.
ATTORNEY United States Patent Office 3,535,137

Patented Oct. 20, 1970

3,535,137

METHOD OF FABRICATING ETCH RESISTANT MASKS

Ivan Haller, Hartsdale, and Michael Hatzakis, Ossining, N.Y., and Rangaswamy Srinivasan, Columbus, Ohio, assignors to International Business Machines Corporation, Armonk, N.Y., a corporation of New York Filed Jan. 13, 1967, Ser. No. 609,145

Int. Cl. B44d *1/50*

U.S. Cl. 117—8 13 Claims

ABSTRACT OF THE DISCLOSURE

A method for manufacturing electron beam degradable, etch resistant, positive resist masks from vinyl-type polymers and copolymers in which one-half the carbon atoms of the main chain are quaternary such as polymethyl methacrylate or cellulose derivatives such as cellulose acetate, the masks being formed into a thin film and portions of the film being exposed to electron beam irradiation to reduce the average molecular weight of the irradiated portions. Prior to irradiation the polymer film is baked to improve adhesion and handling characteristics. After exposure, the portions of reduced average molecular weight are developed by an in situ fractionation step which dissolves only the portions of reduced molecular weight. Subsequently, the developed polymer is subjected to a baking step for a time sufficient to eliminate undercutting resulting from the lateral spreading of radiation during exposure, thereby improving the resolution of the resist. Etching of an underlying substrate is then undertaken with a desired etch.

BACKGROUND OF THE INVENTION

Field of the invention

This invention relates generally to a method for forming etch resistant masks and more particularly relates to a method of manufacturing electron beam degradable positive resists which are useful in the manufacture of integrated circuits or in other arts, such as the printing art. The method is particularly applicable to the integrated circuitry art because of the high resolution attainable.

Description of the prior art

One of the major problems existing in the fabrication of integrated circuits is the attainment of high resolution masks for the etching of protective coatings on the surface of semiconductor materials such as silicon and germanium. Because the size of semiconductor devices is a factor in the ultimate speed of a computer using integrated circuits, intensive efforts are being made to reduce the size of individual components and enhance the packing density of components on an integrated circuit chip. Size reduction has been limited, however, because present technology using photoresists in conjunction with optical masks or lens imaging methods followed by etching and diffusion operations is limited in practical resolution to about 2.5 microns (0.1 mil).

Electron beams, because they can be generated with extremely small diameters, offer an obvious expedient in improving resolution. The use of electron beams as a means of exposing standard photoresists has been investigated in the recent past but they have not proved suitable in resolution capability for integrated circuit device fabrication. For example, one investigation of electron beams which exposed lines on a negative photoresist revealed a smoothly sloping edge of about 2 microns on either side of a 10 micron wide line exposed with a 10 kv. electron beam. Similar ratios of line width to edge slope where the line must be only one micron wide would be intolerable and appear unattainable with negative resists.

Since most known positive and negative resists are responsive to actinic light, it can be appreciated that the high resolutions sought for integrated circuit manufacture cannot be attained because of the limitations imposed by presently used optical systems. Elimination of the optical system and replacing it with a high resolution electron beam system does not mean that the problem is solved, since the effect of electron beam irradiation on polymeric materials cannot be expected to be the same as irradiation with actinic light and, even in instances where exposure with electron beams is possible, resolutions obtained, as shown above with the negative resist-electron beam combination, were not satisfactory. From this, it may be seen that attaining high resolutions is not a function of the energy source alone but is also a function of the properties of the maerial used, among other things.

Although the crosslinking and degradation of certain polymers in bulk using electron beams in the energy range of 100 kev. to 100 mev. has been known for many years in connection with nuclear physics and its applications (Effects of Ionization Radiation on Natural and Synthetic High Polymers, F. A. Bovey, Interscience Publishers, Inc., New York, 1958), the chemical reactions of polymers induced by electron beams of the energy range of 5 to 30 kev. has not been previously investigated. To achieve the results obtained by this invention, electron beams of this lower energy range are superior due to their limited penetration depth, ease of formation of narrow beams, ability to deflect such beams and economic considerations. Furthermore, it does not automatically follow from the chemical reactions of polymers under ionizing radiation that a positive resist can be generated which will be useful from either a process or resolution point of view. The usual problems of adhesion, handling ease, development and etch resistance must still be solved before a useful electron beam activated positive resist of high resolution can be provided.

SUMMARY OF THE INVENTION

In acocrdance with the broad aspect of the present invention, a thin polymeric film is deposited on a substrate which is to be etched. The polymeric film is resistant to all common etches and may be characterized as a positive resist in that it is the energy struck areas which are removed as opposed to the negative resists which utilize the energy struck areas as the mask. Suitable polymers are cellulose derivatives and vinyl-type polymers and copolymers in which one-half of the carbon atoms of the main chain are quaternary. A suitable polymer such as cellulose acetate or polymethyl methacrylate is mixed with a suitable solvent to form a desired concentration of polymer. The resulting resist composition is then coated, preferably by spinning, on a suitable substrate and dried to remove all volatile substances. The dried resist is then baked at 170° C. for approximately thirty minutes in air. This step improves adhesion to the underlying substrate and resistance of the resist to chemical etching. Also, because baking hardens the resist, handling characteristics (i.e., resistance to scratching) are improved. Next, the dried and baked resist is exposed to an electron beam having a charge density in the range of $10^{-5}$ to $2\times10^{-3}$ coulombs/cm.$^2$ at an accelerating potential in the range of 5–30 kv. The exposure to the electron beam causes a degradation or reduction of the average molecular weight of the polymer at selected areas of the film. The degraded areas are of lower molecular weight than the molecular weight of the remainder of the film which is not exposed to electron beam action. The development or removal of the degraded areas is accomplished by an in situ fractionation step. A developing agent consisting of a solvent capable of dissolving the polymer regardless of its molecular weight and a liquid which is incapable of dissolving the polymer, is applied to the film in proportions sufficient to dissolve only the degraded areas to remove these areas. After drying, the developed resist film is baked at 130° C. for thirty minutes to eliminate undercutting and improve the resolution capability of the resist. The above described technique now makes feasible the fabrication of devices of one micron geometry or less.

It is, therefore, an object of this invention to provide a thin polymeric film, electron beam activated, positive resist having high resolution capability.

Another object is to provide a positive resist which provides better resolutions than known resists.

Another object is to provide a positive resist in which the exposed resist is removed by an in situ fractionation technique.

Still another object is to provide a positive resist which is hard, scratch resistant and strongly adherent to a substrate upon which it is deposited.

Yet another object is to provide a positive electron beam actuated resist the resolution of which can be improved by a baking step subsequent to exposure and development.

The foregoing and other objects, features and advantages of the invention will be apparent from the following more particular description of preferred embodiments of the invention as illustrated in the accompanying drawings:

DESCRIPTION OF THE PREFERRED EMBODIMENTS

Figure 1:
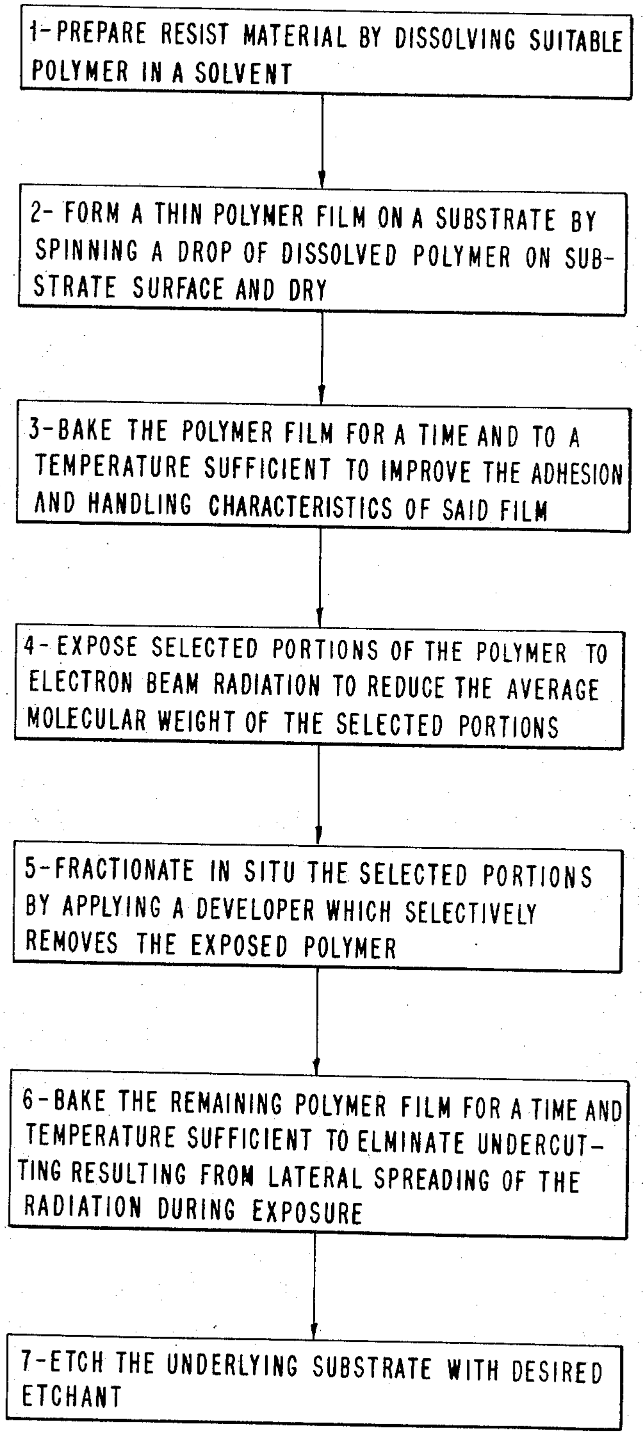
FIG. 1 is a flow chart diagrammatically outlining the principal method steps for fabricating a high resolution positive resist mask.

In accordance with the preferred embodiments of this invention as outlined in flow chart form in FIG. 1, a high resolution positive resist is manufactured as follows:

Step 1.—Prepare the resist material by dissolving a suitable polymer of given molecular weight in a solvent. A preferred polymer such as poly-(methyl methacrylate) having a preferred molecular weight of 10,500 is dissolved in a suitable solvent such as a methyl isobutyl ketone in a concentration of 10%.

Step 2.—Form a thin polymer film on a substrate by spinning a drop of the polymer solution on the surface of a substrate and dry at room temperature.

The substrate may consist of any etchable material such as metals, semiconductors, or metal oxides such as silicon oxide. For example, the substrate may be an oxidized silicon wafer with an oxide thickness of approximately 2,600 A. The resist solution is applied to the substrate while stationary, after which the wafer is spun at 5,000 to 10,000 revolutions per minute for one minute. The thickness of the resist layer appears to be independent of spinning speed as long as the speed is sufficient to produce a uniform layer over the substrate surface. The layer thickness, however, is a function of solution concentration.

After obtaining a uniform layer of the resist on the surface of the substrate, the resist is air dried for 60 minutes at room temperature to remove the solvent and all other volatile components.

Step 3.—Bake the polymer film for a time and to a temperature sufficient to improve the adhesion and handling characteristics of the polymer film.

The coated substrate is baked at a temperature of 170° C. for thirty minutes in air. This step may be carried out in any standard laboratory oven. The baking step does not seriously affect the exposure characteristics of the resist, while it increases its hardness and resistance to scratching. The baking step prior to exposure also affects the ultimate resolution which can be attained because the solubility of slightly exposed areas to the developer is minimized. In other words, undercutting is minimized thereby permitting a closer spacing of the exposed portions of the resist.

Step 4.—Expose selected portions of the polymer film to electron beam or other radiation to reduce the average molecular weight of the selected portions.

Figure 2:
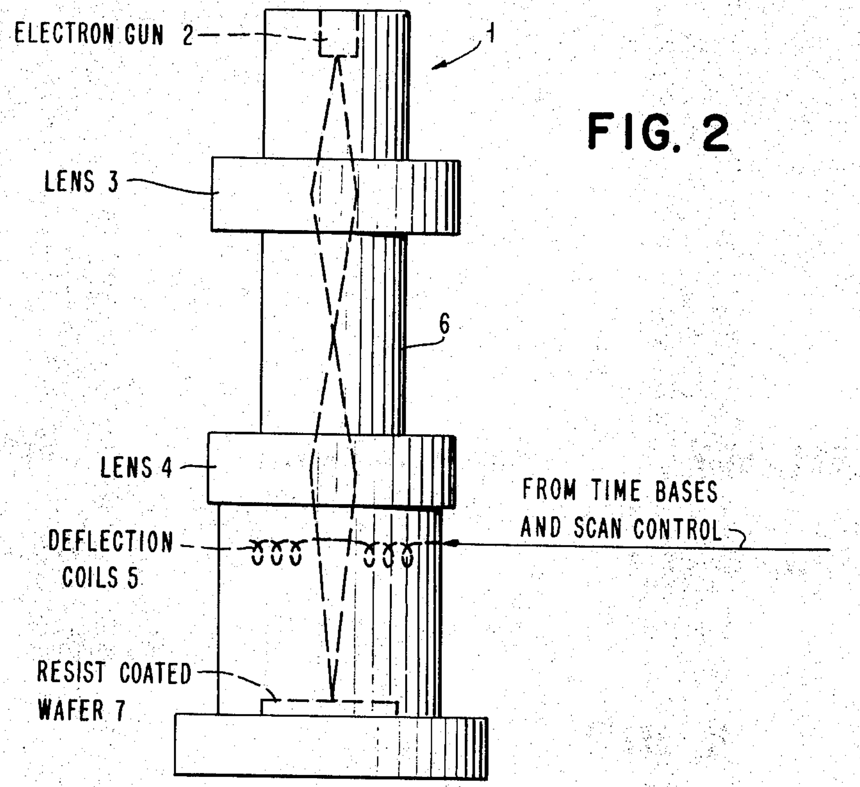
FIG. 2 is a schematic drawing of electron beam apparatus utilized to irradiate selected portions of a polymer film in accordance with the method of the present invention.

After baking, the substrate is inserted into the vacuum chamber of the electron beam apparatus shown in FIG. 2. The electron beam apparatus 1 of FIG. 2 is made up of conventional components and consists of an electron gun 2, lenses 3 and 4, and deflection coils 5; all of which are contained within air-tight housing 6 which is amenable to being pumped down to very low pressures by a vacuum pump arrangement (not shown). In FIG. 2, the resist coated substrate is inserted into the air-tight housing 6 and pumped down to a pressure of approximately $10^{-5}$ torr and exposed by the electron beam at selected portions. The exposure of poly-(methyl methacrylate) was carried out using a beam of 2,000 A. diameter at various accelerating potentials in the range of 5 to 30 kilovolts and at a charge density of $10^{-5}$ to $2\times10^{-3}$ coulombs/cm.$^2$. For poly-(methyl methacrylate) the best results were attained using a charge density in a range of $5\times10^{-5}$ to $5\times10^{-4}$ coulombs/cm.$^2$.

Exposure of the resist material was not significantly affected by a variation in accelerating potential. Accelerating potential is critical only to the extent that a sufficiently large accelerating potential must be applied to penetrate all the way through the layer of resist. Exposure of the resist to charge densities in excess of the exposure range defined hereinabove, causes reactions leading to cross-linking to dominate, and the resist in over exposed areas cannot be removed. The desired effect in exposing the resist to radiation is to reduce the average molecular weight to over exposure which leads to cross-linking cannot be tolerated.

Step 5.—Fractionate in situ the selected portions by applying a developer which selectively removes the exposed polymer.

Development of the exposed areas is based on a technique of fractionation of a polymer according to molecular weight. The developer may be applied to the surface of the exposed resist or the entire substrate may be dipped into a beaker of the developer. The developer consists of a mixture of a solvent capable of dissolving the polymer regardless of its molecular weight and a liquid which is incapable of dissolving the polymer regardless of its molecular weight, in proportions sufficient to dissolve only the exposed portions. The action of the electron beam on the polymer, as indicated hereinabove, is to reduce the average molecular weight of the irradiated portions. The fractionation technique results from an appreciation that given a liquid A, which is a good solvent for a particular polymer of any molecular weight, and a different liquid, B, which is not a solvent for the same polymer regardless of its molecular weight, it is possible to find a composition of a mixture of A and B that will act as a solvent for the polymer below a critical molecular weight, and as a nonsolvent for the same polymer above a critical molecular weight. In the formulation of the developer, one adjusts the proportions of the two liquids so that all molecular weights below a certain molecular weight are dissolved. The certain molecular weight chosen lies between the molecular weight of the starting material and the molecular weight of the degraded polymer. The degradation in molecular weight due to irradiation is, however, sufficiently great that a rather wide variation in composition is allowed. The composition, though, should be adjusted so that the molecular weights it dissolves are significantly less than the starting molecular weight.

The foregoing should be taken into consideration because polymers, as prepared, are generally not monodisperse, i.e., the individual molecules do not all have identical molecular weights. It should be clear that the broader the initial distribution, the further the degradation must be carried out before a clear distinction between exposed and unexposed areas can be made. It is possible, however, to increase the sensitivity to exposure by using more nearly monodisperse polymers. The choice of average molecular weight for the starting material is based on practical considerations such as viscosity for coating solutions, availability and, of course, final performance. Development time is another practical parameter which should be considered. Development times in the neighborhood of one minute have been attained with polymers of the present invention. In developing the degraded poly-(methyl methacrylate) a mixture of a solvent methyl isobutyl ketone and a nonsolvent isopropanol in a 30:70 ratio is suitable for dissolving the irradiated portions of lower molecular weight. Upon completion of development, the resist is dried in air or Freon 12.

Step 6.—Bake the remaining polymer film for a time and temperature sufficient to eliminate undercutting resulting from the lateral spreading of radiation during exposure.

Figure 3:
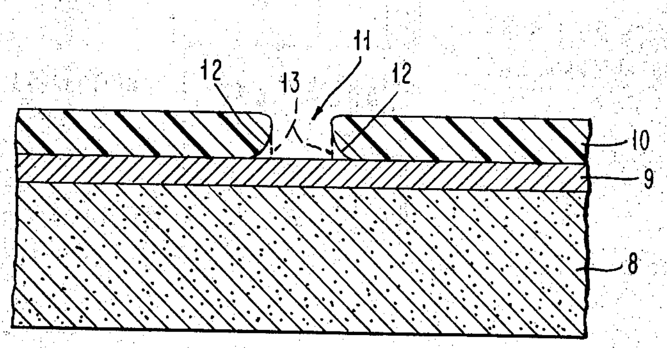
FIG. 3 is a cross-section view of an oxidized semiconductive substrate, the oxide of which is to be etched, showing the condition of a cut-out in the resist before and after baking to improve the resolution.

During exposure of the resist with electron beam radiation, lateral spreading of the beam causes an undercutting of the resist which broadens the minimum line width obtainable thereby affecting the resolution capability of the resist. Referring now to FIG. 3, there is shown a semiconductor substrate 8 such as silicon having an oxidized layer 9 in overlying relationship with substrate 8 and having a layer of photoresist 10 disposed in overlying relationship with layer 9. Layer 10 contains a cut-out portion 11 resulting from the development of an exposed portion of photoresist layer 10 to electron beam radiation. The sides 12 of cut-out portion 11 slope inwardly from the surface of resist layer 10 to such an extent that the width of cut-out region 11 at the surface of layer 9 is greater than the width at the upper surface of layer 10. Dotted lines 13 show the extent to which the resist changes dimensions when subjected to baking for a given time at a desired temperature. Generally speaking the baking should be carried out at temperatures below the temperature at which the resist flows. Preferably, the resist should be subjected to temperatures which cause the resist to soften and slowly change in dimension until the dimensions of the originally developed pattern are attained. In the case of poly-(methyl methacrylate), a baking at 130° C. for thirty minutes substantially eliminated undercutting which resulted from the lateral spreading of the beam during exposure. A higher baking temperature for a shorter time will, of course, attain the same results. For instance, by baking at 160° C. for thirty seconds the same results can be attained as by baking at 130° C. for thirty minutes.

Step 7.—Etch the underlying substrate with a desired etchant.

Common etchants such as hydrofluoric and hydrochloric acids have been successfully utilized in etching the underlying substrate. The type of etchant used, of course, is dependent upon the material makeup of the underlying substrate. There is no reason to believe that other common etchants, either acidic or basic, could not be used with the poly-(methyl methacrylate) resist.

The above outlined disclosure has been described in connection with a preferred polymer and with parameters which are relevant to the manufacture of a positive resist mask consisting of poly-(methyl methacrylate). It should, however, be appreciated that other suitable polymers such as cellulose derivatives, and vinyl type polymers and copolymers in which one-half of the carbon atoms of the main chain are quaternary can also be used. Specifically, cellulose acetate and ethyl cellulose were found suitable, but other cellulose esters such as cellulose propionate cellulose acetate-butyrate, cellulose triacetate, cellulose acetate, N,N-diethylaminoacetate, etc., and other cellulose ethers, such as methyl cellulose, N,N-diethylaminoethyl cellulose, carboxymethyl cellulose, etc., are also contemplated for use.

The vinyl type polymer and copolymers mentioned hereinabove can be represented by the formula:

$$\left[ -CH_2-\underset{R_2}{\overset{R_1}{\underset{|}{\overset{|}{C}}}}- \right]_n$$

where $R_1$ and $R_2$ are substituents selected from the group of $CH_3$, $C_6H_5$, $COOCH_3$, $COOC_2H_4OH$, etc. Polymers falling into this category, which were found suitable, in addition to poly-(methyl methacrylate) include poly-isobutylene, poly-α-methyl-styrene) and methyl methacrylate 2-hydroxyethyl methacrylate copolymer. The use of other materials falling in this group, such as polymers of various esters of methacrylic acid, poly-methacrylo nitrile, and derivatives of the above mentioned polymers, is also contemplated. The above described polymers appear in forms having a wide range of molecular weights. The molecular weight of the polymer is not critical in the practice of the present invention but a preferred range of molecular weight of from 6,000 to 20,000 has been found most suitable.

Electron beam radiation has been indicated in the embodiment described hereinabove as the preferred way of exposing the polymer to reduce the average molecular weight of the exposed portions. It should be appreciated that other types of radiation such as X-rays, light and nuclear radiation can act to reduce the average molecular weight of a polymer in the same manner as an electron beam and that these other forms of radiation may be utilized in the practice of this invention.

The above recited polymers are coated on substrates previously prepared from solutions. In the following Table I the polymers utilized and their associated solvents and polymer concentration are listed.

TABLE I

| Polymer | Solvent | Concentration, percent |
|---|---|---|
| Poly-(methyl-methacrylate) | Methyl isobutyl ketone | 10 |
| Poly-isobutylene | Trichloroethylene | 5 |
| Poly-(α-methyl-styrene) | do | 15 |
| Methyl methacrylate 2-hydroxyethyl methacrylate copolymer. | Methyl isobutyl ketone | 10 |
| Cellulose acetate | 1:1 cyclohexanone methyl ethyl ketone mixture. | 4 |
| Ethyl cellulose | 4:1 toluene ethanol | 5 |

The percent concentration of each of the polymers set down in Table I above is not critical but was found to be suitable in the formation of the resist masks and is principally determined by the required resist thickness (about 5,000 A.) achievable with a given spinning speed and acceleration.

The baking step prior to exposure to radiation may be carried out over a temperature range of 150° C. to 180° C. but, again, the baking temperature is not critical but is more or less a function of the characteristics of the particular polymer. In general, the higher the temperature used, the shorter the time baking necessary.

With respect to the exposure step, the polymers described hereinabove can be exposed by charge densities in the range $10^{-5}$ to $2\times10^{-3}$ coulombs/cm.$^2$ at accelerating voltages of from 5 to 30 kv. The accelerating voltage is, of course, a function of the thickness of the resist and at a 30 kv. accelerating potential approximately 25 microns of organic material can be penetrated by the electron beam.

The development step as outlined hereinabove in connection with the manufacture of the poly-(methyl methacrylate) etch resistant mask can be applied to the other polymers mentioned hereinabove. Table II below lists other polymers along with the solvent and nonsolvent utilized and further shows the ratio of solvent to nonsolvent to provide an optimum developer for the polymers listed. In addition, Table II shows the minimum exposure at 10 kv. and the resolution in microns obtained using a 2,000 A. beam. All the developers utilized have a development time not exceeding one minute.

being selected from the group consisting of cellulose derivatives and vinyl type polymers and copolymers in which one-half of the carbon atoms in the main chain are quaternary having the following formula:

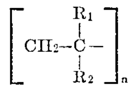

where $R_1$ and $R_2$ are constituents selected from $CH_3$, $C_6H_5$, $COOCH_3$ and $COOC_3H_4OH$;

(b) continuing said exposure until substantial degradation of said polymeric material to lower molecular weight products is effected in the exposed areas;

(c) treating said exposed areas of said polymeric film with a solvent which is a solvent for said degradation products but which is a non-solvent for said unexposed polymeric film to thereby develop a resist image having a resolution of 1 micron or less; and thereafter (d) baking said resist image at a temperature and for a time sufficient to substantially eliminate undercut-

TABLE II.—PROPERTIES OF POSITIVE ELECTRON BEAM RESISTS

| Resist | Optimum developer | | | Minimum exposure at 10 kv. (cb./cm.$^2$) | Resolution (micron) |
|---|---|---|---|---|---|
| | Solvent | Nonsolvent | Ratio | | |
| Cellulose acetate | 1:1 methyl ethyl ketone ethonol mixture | Toluene | 40:60 | $5\times10^{-4}$ | <0.8 |
| Poly-isobutylene | 1:1 methylene chloride benzene mixture | Ethanol | 70:30 | $5\times10^{-5}$ | 2 |
| Poly-($\alpha$-methylstyrene) | benzene | do | 10:60 | $10^{-4}$ | 2 |
| Poly-(methyl methacrylate) | methyl ethyl ketone | Isopropanol | 30:70 | $5\times10^{-5}$ | <0.8 |
| Methyl methacrylate, 2-hydroxyethyl methacrylate copolymer | methyl ethyl ketone | do | 30:70 | $5\times10^{-5}$ | <0.8 |

With respect to the baking step subsequent to development, all the polymer materials undergo improvement in resolution when subjected to the baking step. The temperature utilized is critical only in so far as it should not exceed the temperature at which the resist flows. However, it should be appreciated that the baking temperature should not be so low as to preclude the softening of the resist and consequent change in dimension which improves the resolution of the resist. Experiments have indicated that for temperatures as low as 100°, there is some improvement in the resolution of the baked resist. There is, however, a temperature which if applied for a given time for each resist, will permit the resist to change in dimension so that it achieves the dimensions of the originally developed pattern.

As a result of the method described hereinabove, resists of extremely high resolution are provided. Because of the baking steps subsequent to development, the resolutions attained were much higher than could be attained if the masks were used immediately after development. Because undercutting is substantially eliminated, edge profiles of lined images very sharp in both the exposed and developed resist and in the subsequently chemically etched material underlying the resist. The repeatability of the process is excellent and, therefore, is amenable to production line techniques. The achievement of a resist of such high resolution makes the fabrication of devices of one micron geometry or less more feasible now then it has been in the past using the prior art techniques.

While the invention has been particularly shown and described with reference to preferred embodiments thereof, it will be understood by those skilled in the art that various changes in the steps and details may be made therein without departing from the spirit and scope of the invention.

What is claimed is:

1. A method for the production of a positive resist image comprising the steps of:

(a) exposing a film of a polymeric material to low energy electron beam radiation of about 5 to 30 kev. in a predetermined pattern, said polymeric material ting resulting from the lateral spreading of said radiation in the polymer during exposure.

2. A method according to claim 1 wherein said vinyl-type polymers and copolymers include vinyl-type polymers and copolymers selected from the group consisting of poly-isobutylene, poly-($\alpha$-methyl-styrene), poly-methyl methacrylate, and methyl methacrylate, 2-hydroxyethyl methacrylate copolymer.

3. A method according to claim 1 wherein the step of baking said resist image is carried out at a temperature of about the softening temperature of said polymers.

4. A method according to claim 1 wherein the step of baking said resist image is carried out at a temperature of 130° C. for thirty minutes when said polymer is methyl methacrylate.

5. A method according to claim 1 wherein said low energy electron beam has a charge density in a range of $10^{-5}$ coulombs/cm.$^2$–$2\times10^{-3}$ coulombs/cm.$^2$ and an accelerating potential in a range of 5–30 kv.

6. A method according to claim 1 wherein said cellulose derivatives include cellulose derivatives selected from the group consisting of cellulose ethers and cellulose esters.

7. A method according to claim 6 wherein said cellulose ethers include cellulose ethers selected from the group consisting of ethyl cellulose and methyl cellulose.

8. A method according to claim 6 wherein said cellulose esters include cellulose esters selected from the group consisting of cellulose acetate, cellulose propionate and cellulose acetate butyrate.

9. A method according to claim 1 wherein said given molecular weight of polymers is in a range of 6,000 to 20,000.

10. A method according to claim 1 wherein said given molecular weight of said polymer is preferably 10,500.

11. A method according to claim 1 further including the step of baking said polymer film, prior to exposing the same, at a temperature and for a time sufficient to enhance adhesion of said polymer to said substrate.

12. A method according to claim 11 wherein the step of baking prior to exposing said polymer film is carried out over a temperature range of 150° C.–180° C. for thirty minutes.

13. A method according to claim 11 wherein the step of baking prior to exposing said polymer film is carried out at a temperature of 170° C. for thirty minutes.

References Cited

UNITED STATES PATENTS

| | | | |
|---|---|---|---|
| 2,892,712 | 6/1959 | Plambeck | 96—36.3 X |
| 2,895,891 | 7/1959 | Miller | 204—160.1 |
| 2,989,492 | 6/1961 | Sanderson | 117—161 X |
| 3,196,008 | 7/1965 | Mihajlov et al. | 117—8 X |

OTHER REFERENCES

Teach, Kiessling: Polystyrene, New York, Reinhold Pub. Corp., 1960, pp. 54–57.

Chapiro: Radiation Chemistry of Polymeric Systems, New York, Interscience Publishers, 1962, pp. 537–538, 355 and 499.

ALFRED L. LEAVITT, Primary Examiner

W. E. BALL, Assistant Examiner

U.S. Cl. X.R.

117—93.31; 156—8, 12, 13; 204—159.11